United States Patent
Jaladanki et al.

(10) Patent No.: US 11,595,033 B2
(45) Date of Patent: Feb. 28, 2023

(54) COMPARATOR ARCHITECTURE FOR REDUCED DELAY AND LOWER STATIC CURRENT

(71) Applicant: Texas Instruments Incorporated, Dallas, TX (US)

(72) Inventors: Vishnuvardhan Reddy Jaladanki, Bangalore (IN); Preetam Charan Anand Tadeparthy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/515,018

(22) Filed: Oct. 29, 2021

(65) Prior Publication Data
US 2022/0166419 A1    May 26, 2022

(30) Foreign Application Priority Data

Nov. 17, 2020   (IN) .............................. 202041049940

(51) Int. Cl.
*H03K 5/24*   (2006.01)

(52) U.S. Cl.
CPC ..................................... *H03K 5/24* (2013.01)

(58) Field of Classification Search
CPC ......... H03K 5/156; H03K 5/08; H03K 5/1534
USPC .......................................................... 327/65
See application file for complete search history.

(56) References Cited

U.S. PATENT DOCUMENTS

| | | | |
|---|---|---|---|
| 4,649,293 A | 3/1987 | Ducourant | |
| 4,912,420 A * | 3/1990 | Parnell | H03K 5/08 327/78 |
| 5,146,114 A | 9/1992 | Feldtkeller | |
| 7,592,844 B2 * | 9/2009 | Colbeck | H03F 3/4521 330/251 |
| 8,054,141 B2 | 11/2011 | Saw | |
| 8,610,422 B2 * | 12/2013 | Figueiredo | H03F 3/45183 330/257 |

(Continued)

FOREIGN PATENT DOCUMENTS

| JP | 2014195128 A | * 10/2014 |
|---|---|---|
| KR | 100311033 B1 | 12/2001 |

OTHER PUBLICATIONS

PCT International Search Report; PCT/US 2021/059318; dated Feb. 24, 2022.

*Primary Examiner* — Quan Tra
(74) *Attorney, Agent, or Firm* — Ray A. King; Frank D. Cimino

(57) ABSTRACT

Described embodiments include a comparator circuit comprising an input voltage terminal, a reference voltage terminal, and a rising edge decode circuit having inputs coupled to the input voltage terminal and the reference voltage terminal. The rising edge output provides a rising edge decode signal indicating the input signal transitioned from being smaller than the reference voltage signal to being larger than the reference voltage signal. A falling edge decode circuit has inputs coupled to the input voltage terminal and the reference voltage terminal, and a falling edge output providing a falling edge decode signal indicating that the input signal transitioned from being larger than the reference voltage signal to being smaller than the reference voltage signal. Also, a decode logic circuit provides a comparator output in response to the rising edge decode signal and the falling edge decode signal.

15 Claims, 4 Drawing Sheets

(56) References Cited

U.S. PATENT DOCUMENTS

| | | | |
|---|---|---|---|
| 8,710,869 B2 * | 4/2014 | Hazucha | H03K 5/2481 327/66 |
| 9,143,119 B2 | 9/2015 | Sohn | |
| 9,543,938 B2 | 1/2017 | Park et al. | |
| 9,608,614 B2 | 3/2017 | Sugiyama et al. | |
| 9,906,212 B2 | 2/2018 | Sugiyama et al. | |
| 10,700,674 B1 | 6/2020 | Hsu | |
| 2005/0239433 A1 * | 10/2005 | Klein | H03K 5/2481 455/574 |
| 2016/0322902 A1 | 11/2016 | Tsuruyama et al. | |
| 2018/0191307 A1 * | 7/2018 | Lei | H03F 3/45179 |
| 2019/0214977 A1 * | 7/2019 | Verdant | H03K 5/2481 |
| 2019/0238150 A1 | 8/2019 | Eitan et al. | |

\* cited by examiner

COMPARATOR ARCHITECTURE FOR REDUCED DELAY AND LOWER STATIC CURRENT

CROSS-REFERENCE TO RELATED APPLICATION

This application claims priority to India Patent Application No. 202041049940 filed Nov. 17, 2020, which is incorporated herein by reference.

BACKGROUND

This description relates to comparators. A comparator is a device that compares two voltages or currents at its inputs and outputs a digital signal indicating which of the inputs is larger. A comparator typically has two analog inputs and one binary digital output. Comparators are sometimes used, for example, to determine whether an input has reached a predetermined threshold value.

It is generally desirable for a comparator to have faster rise and fall times (i.e. lower delay) than an operational amplifier. However, the decreased delay comes with a tradeoff against other parameters such as bias current, offset, etc. Methods and circuits that are implemented to attain lower comparator delay may lead to a higher bias current, which is an undesirable result. Even a higher bias current may not decrease the comparator delay beyond a certain limit after the transconductance ($g_m$) of the input stage transistor is saturated.

The transconductance of a transistor increases linearly as the bias current increases, but only until the saturation point is reached. After transconductance saturation occurs, no further improvement in delay times can be achieved by increasing the bias current. Accordingly, a limit exists on how much increasing the bias current can decrease the delay. Also, increasing the bias current increases power consumption and decreases battery life. A need exists for a comparator having shorter delay times while also maintaining an acceptably low power consumption.

SUMMARY

The first described embodiment presents a comparator circuit comprising an input voltage terminal configured to receive an input signal, a reference voltage terminal configured to receive a reference voltage signal, a rising edge decode circuit having first and second rising edge inputs and a rising edge output, the first rising edge input coupled to the input voltage terminal and the second rising edge input coupled to the reference voltage terminal. The rising edge output provides a rising edge decode signal indicating the input signal transitioned from being smaller than the reference voltage signal to being larger than the reference voltage signal.

A falling edge decode circuit has first and second falling edge inputs and a falling edge output, the first falling edge input coupled to the input voltage terminal, the second rising edge input coupled to the reference voltage terminal, and the falling edge output providing a falling edge decode signal indicating the input signal transitioned from being larger than the reference voltage signal to being smaller than the reference voltage signal. Also, a decode logic circuit has first and second logic inputs and a comparator output, the first logic input is coupled to the rising edge output, the second logic input is coupled to the falling edge output, and the comparator output is configured to provide a digital output signal in response to the rising edge decode signal and the falling edge decode signal.

The second described embodiment presents a comparator circuit comprising an input voltage terminal configured to receive an input signal, an upper reference voltage terminal configured to receive an upper reference voltage signal, a lower reference voltage terminal configured to receive a lower reference voltage signal, a rising edge decode circuit having first and second rising edge inputs and a rising edge output, the first rising edge input coupled to the input voltage terminal, the second rising edge input coupled to the upper reference voltage terminal, and the rising edge output providing a rising edge decode signal indicating the input signal transitioned from being smaller than the upper reference voltage signal to being larger than the upper reference voltage signal, A falling edge decode circuit has first and second falling edge inputs and a falling edge output. The first falling edge input is coupled to the input voltage terminal, the second rising edge input is coupled to the lower reference voltage terminal, and the falling edge output provides a falling edge decode signal indicating the input signal transitioned from being larger than the lower reference voltage signal to being smaller than the lower reference voltage signal. A decode logic circuit has first and second logic inputs and a comparator output. The first logic input is coupled to the rising edge output, the second logic input is coupled to the falling edge output, and the comparator output is configured to provide a digital output signal in response to the rising edge decode signal and the falling edge decode signal.

The third described embodiment presents a comparator circuit comprising an input voltage terminal configured to receive an input signal and a reference voltage terminal configured to receive a reference voltage signal. A first transistor has a first control terminal and first and second transistor current terminals, wherein the first control terminal is coupled to the input voltage terminal. A second transistor has a second control terminal and third and fourth transistor current terminals. The second control terminal is coupled to the reference voltage terminal, the third transistor current terminal is coupled to an output terminal, and the fourth transistor current terminal coupled to the second transistor current terminal.

A third transistor is coupled between a power supply terminal and the first transistor current terminal, and a fourth transistor is coupled between the power supply terminal and the third transistor current terminal, wherein the third and fourth transistors form a current mirror. A switch is coupled between the second transistor current terminal and ground, and a capacitor coupled between the second transistor current terminal and ground.

DETAILED DESCRIPTION

In this description, the same reference numbers depict the same or similar (by function and/or structure) features. The drawings are not necessarily drawn to scale.

Figure 1:
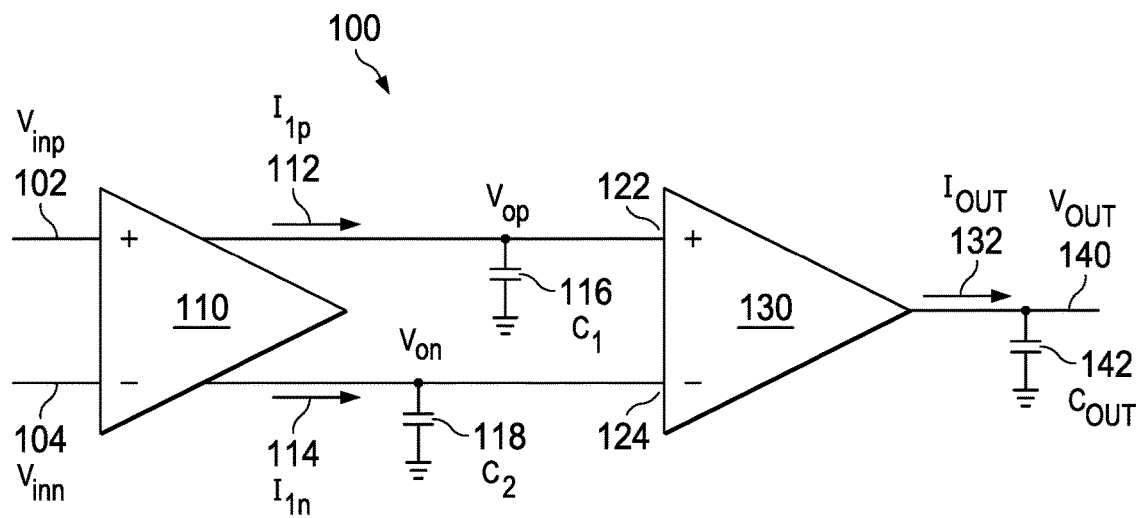
FIG. 1 shows an example of a two-stage comparator having a differential input and a single-ended output.

A comparator may have multiple stages depending upon the requirements of the comparator. FIG. 1 shows a two-stage comparator 100 having a differential input and a single-ended output. The first stage 110 has a fully differential input, $V_{inp}$ 102 and $V_{inn}$ 104. The output of the first stage 110 is a differential current output, $I_{1p}$ 112 and $I_{1n}$ 114. The magnitudes of currents $I_{1p}$ 112 and $I_{1n}$ 114 are proportional to the difference between the voltages at the positive input $V_{inp}$ 102 and the negative input $V_{inn}$ 104. The current $I_{1p}$ 112 flows through capacitance $C_1$ 116 to ground and generates voltage $V_{op}$. The current $I_{1n}$ 114 flows through capacitance $C_2$ 118 to ground and generates voltage $V_{on}$. Capacitance $C_1$ 116 and capacitance $C_2$ 118 represent combinations of the output capacitance of the first stage 110 and the input capacitance of the second stage 130, and are parasitic capacitances, not capacitor components. In many cases, the capacitance values of $C_1$ 116 and $C_2$ 118 are the same.

The second stage 130 of comparator 110 is a differential to single-ended stage that determines the comparator output 132 based on $V_{op}$ and $V_{on}$. A first input 122 of the second stage 130 is coupled to capacitance 116 and receives voltage $V_{op}$. A second input 124 of the second stage 130 is coupled to capacitance 118 and receives voltage $V_{on}$. The output of the second stage 130 is Iout 132. The current Iout 132 flows through capacitor $C_{out}$ 142 to ground and generates voltage $V_{out}$ 140, which is the output of comparator 100.

The first stage outputs 112 and 114 reach voltage values of $V_{op}$ and $V_{on}$, respectively, in time dt1. The time dt1 can be referred to as the delay of the first stage 110. The value for the delay dt1 is given by the equation (1):

$$dt1 = \frac{C1(V_{op} - V_{on})}{(i1p - i1n)} \quad (1)$$

where C1 is the parasitic capacitance on the first stage output, $V_{op}$ and $V_{on}$ are the voltages across capacitances 116 and 118, and $I_{1p}$ and $I_{1n}$ are the differential current outputs of the first stage 110.

The delay dt1 is decreased by a larger difference between the currents $I_{1p}$ and $I_{1n}$, because the difference between $V_{op}$ and $V_{on}$ will reach the threshold value more quickly. The $V_{on}$ node discharges as the $V_{op}$ node is charged, thus creating a differential input voltage for the second stage 130. After the magnitude of the differential input voltage increases beyond a threshold value, the second stage 130 determines the comparator output $V_{OUT}$ 140. The time required for $V_{op}$ and $V_{on}$ to reach the threshold value, and for the second stage to determine the comparator output is dt1, which is the delay of the first stage. If $V_{op}$ and $V_{on}$ are fixed values, the delay dt1 is dependent only upon the charging and discharging currents flowing through the parasitic capacitances 116 and 118.

Figure 2:
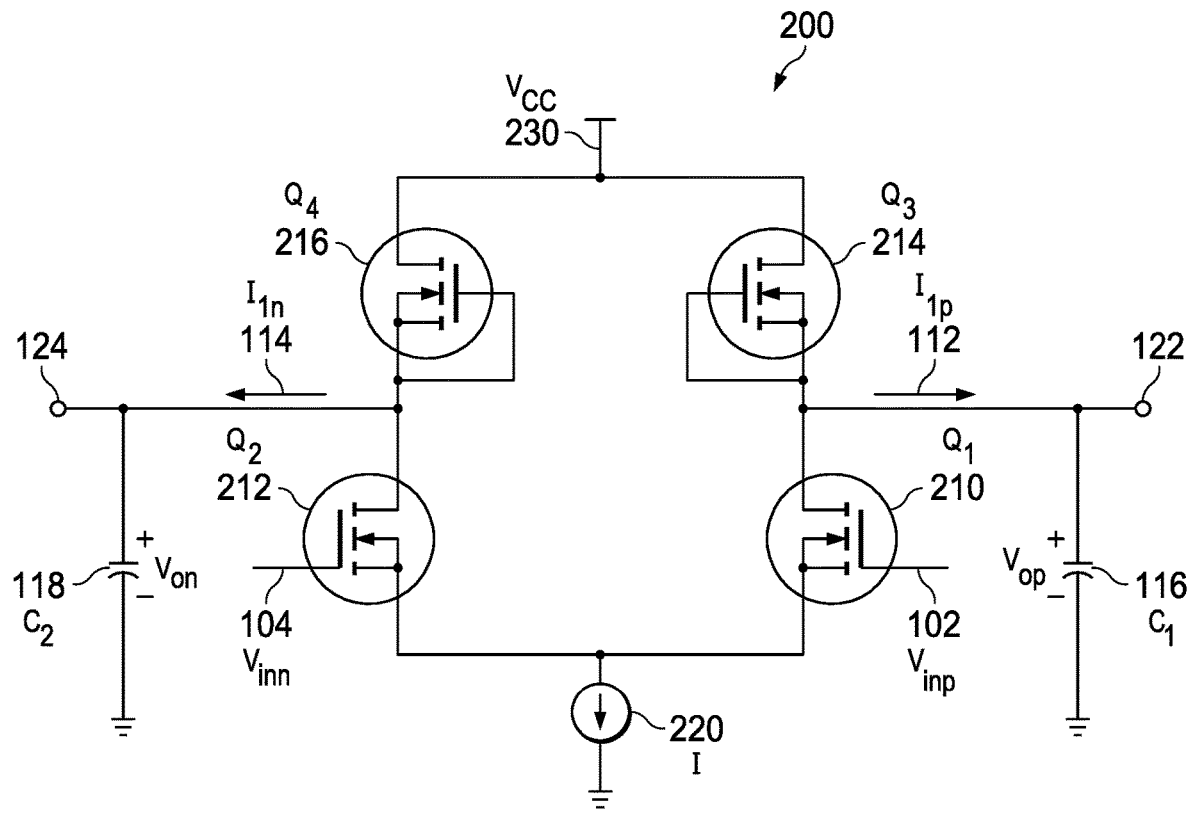
FIG. 2 is a schematic diagram for an example first stage of a comparator.

FIG. 2 is a schematic diagram for an example first stage 200 of a comparator. The differential input signals $V_{inp}$ 102 and $V_{inn}$ 104 are provided to the gates of transistors Q1 210 and Q2 212, respectively. The drain of transistor Q2 212 is coupled to the drain of transistor Q4 216. The drain of transistor Q1 210 is coupled to the drain of transistor Q3 214. The gate and source of transistors Q2 212 and of Q1 210 are each connected together. The drain of transistors Q2 212 and Q1 210 are connected to a power supply $V_{CC}$ 230.

The drain of transistor Q1 210 provides current Iip 112. $I_{1P}$ 112 is equal to the differential current between Q3 214 and Q1 210. The drain of transistor Q2 212 provides current $I_{1N}$ 114. $I_{1NP}$ 114 is equal to the differential current between Q4 216 and Q2 212. The current Iip 112 charges capacitance 116 resulting in a voltage across capacitance 116 of $V_{op}$, which is provided to the positive terminal 122 of the second stage of the comparator. The current $I_{1N}$ 114 charges capacitance 118 resulting in a voltage across capacitance 118 of $V_{on}$, which is provided to the negative terminal 124 of the second stage of the comparator.

The sources of transistors Q1 210 and Q2 212 are coupled to a first terminal of current source 220. The second terminal of current source 220 is coupled to ground. In some embodiments, current source 220 is a transistor. Current source 220 provides a tail current I. The maximum value of $I_{1P}$ 112 and $I_{1N}$ 114 are limited by the tail current I supplied by current source 220.

If $V_{inp}$ 102 is much larger than $V_{inn}$ 104, then Q2 212 will be turned off, and all the tail current I will flow through Q1 210. If Q2 212 is turned off, $I_{1P}$ 112 will be equal to the tail current I from current source 220. In this case, the maximum voltage value of $V_{op}$ across C1 116 is determined by the tail current I.

The delay dt1 of the first stage 110 is inversely proportional to Iip 112 and $I_{1N}$ 114, which is limited by the tail current I. The second stage 130 is a differential to single-ended stage. The delay of the second stage 130 is inversely proportional to the square root of the tail current I. Therefore, obtaining a lower comparator delay requires higher tail current I. However, increasing the tail current I also increases the power consumption of the comparator. Also, the higher current is always flowing through the input transistors, even when it is not needed, because the tail current is increased independent of the state of the input signal.

Improvements that can be made to comparator 100 include (1) for the comparator to only draw current during the period of comparator output determination, thus reducing the power consumption of the comparator, and (2) for the tail current to be increased during the period of comparator output determination, thus reducing the delay dt1. Each of these improvements can be accomplished by replacing the tail current source with a voltage source.

If the fixed tail current source 220 is a capacitor, then the current through the differential pair will be determined by the magnitude of the input signal. A higher magnitude of tail current can be achieved by replacing the fixed tail current source 220 with a capacitor. Also, because the capacitor acts as an open circuit in a static or DC operating condition, no current flows while the inputs are static. If the comparator inputs are non-changing or are held at the same value for an extended time, the comparator quiescent current may drop to near zero because the current sourcing capacitor will act as an open circuit under those conditions.

Figure 3:
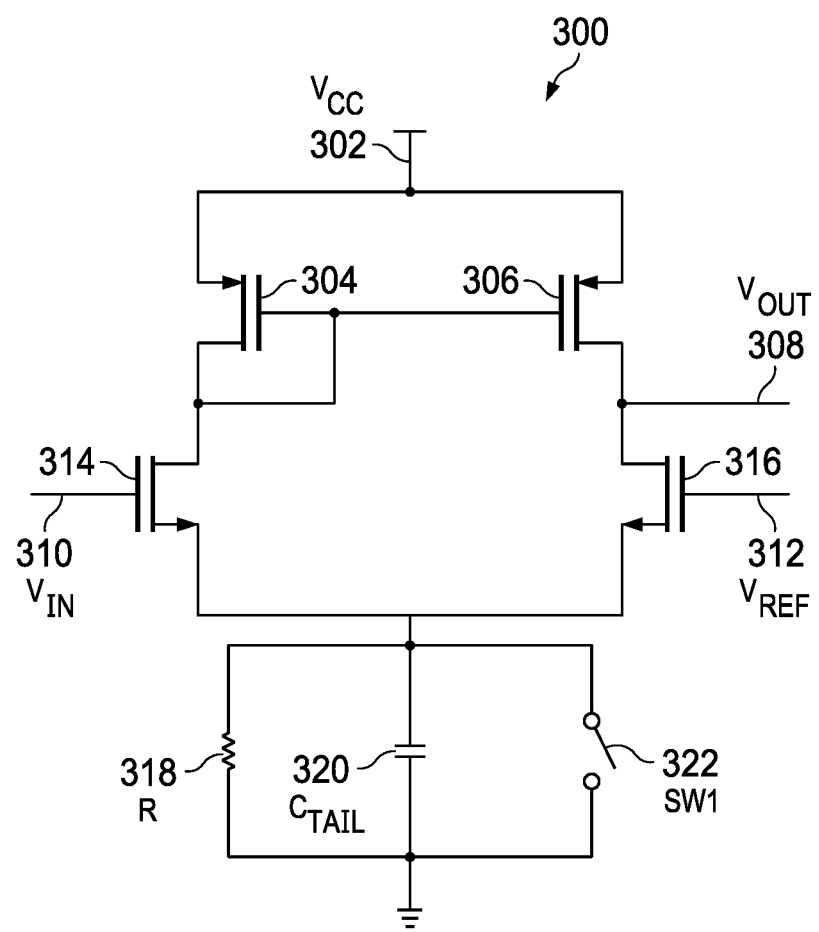
FIG. 3 is a schematic diagram for an example continuous-time comparator where a first comparator input signal is a fixed threshold reference signal, and a second comparator input signal is dynamic.

FIG. 3 is a schematic diagram for an example continuous-time comparator 300 where a first comparator input signal $V_{REF}$ 312 is a fixed threshold reference signal, and a second comparator input signal $V_{IN}$ 310 is dynamic. The output signal $V_{OUT}$ 308 changes in response to the comparator input signal $V_{IN}$ 310 transitioning either above or below the threshold reference signal $V_{REF}$ 312.

The comparator input signal $V_{IN}$ 310 is provided to the gate of transistor 314. The threshold reference signal $V_{REF}$ 312 is provided to the gate of transistor 316. Transistor 304 is coupled between the supply voltage terminal $V_{CC}$ 302 and the drain of transistor 314. Transistor 306 is coupled between the supply voltage terminal $V_{CC}$ 302 and the drain of transistor 316. The gate of transistor 304 is coupled to the drain of transistor 314 and the gate of transistor 306. The comparator output signal $V_{OUT}$ 308 is provided by the drain of transistor 316. The tail capacitor $C_{TAIL}$ 320 is coupled in parallel with resistor 318 and switch SW1 322. The parallel combination of $C_{TAIL}$ 320, resistor 318 and switch SW1 322 is coupled between ground and the sources of transistors 314 and 316.

Capacitor $C_{TAIL}$ 320 is precharged to ground by closing switch SW1 322. After the precharging of $C_{TAIL}$ 320 is complete, switch SW1 322 is opened. Resistor 318 is connected in parallel with $C_{TAIL}$ 320 to speed up the response to slowly moving or static signals by providing a discharge path. Resistor 318 is useful in continuous time systems because the input may not be changing or may be only changing slowly, and the static signals need to be decoded quickly and correctly. If a transient in $V_{IN}$ 310 occurs, $C_{TAIL}$ 320 will provide a low impedance. If $V_{IN}$ 310 is static, $C_{TAIL}$ 320 will provide a very high impedance, and the current will be very minimal. Depending upon the frequency of $V_{IN}$ 310 and the desired delay dt1, switch SW1 322 may be omitted in some embodiments.

It is important that $C_{TAIL}$ 320 reaches its final value before a comparator output determination is made. After an output determination is made, $C_{TAIL}$ 320 can be discharged. Closing switch SW1 322 resets the value of $C_{TAIL}$ 320 to a desired value. $C_{TAIL}$ 320 can be charged to a different value depending upon the input $V_{IN}$ 310 being high or low. If $V_{IN}$ 310 is near zero, and if $C_{TAIL}$ 320 is reset to a voltage slightly above (Vref–Vth), where Vth is the threshold voltage of transistor 314, and both the input transistor pairs will be off. As the value of $V_{IN}$ 310 rises, current will flow in the input branch, and that current will be mirrored to drive the comparator decode output $V_{OUT}$ 308.

With the configuration of comparator 300, the delay dt1 may only see an improvement in the rise time, and not a significant improvement in the fall time. If $V_{IN}$ 310 is near zero, $C_{TAIL}$ 320 is at $(V_{REF}-V_{th})$, and $V_{OUT}$ 308 will remain low. When $V_{IN}$ 310 goes from near zero to $V_{CC}$, transistor 314 will be turned on and drawing current. The current through transistor 314 will be mirrored by transistors 304 and 306, and $V_{OUT}$ 308 will go high, giving a rising edge decode. If $V_{IN}$ 310 remains at $V_{CC}$ long enough, $C_{TAIL}$ 320 will be charged to a voltage of $(V_{CC}-V_{th})$. After $C_{TAIL}$ 320 rises to a voltage of $(V_{CC}-V_{th})$, transistor 314 will be turned off.

If $V_{IN}$ 310 transitions back to near zero (falling edge), transistor 314 will be turned off and $C_{TAIL}$ 320 will go back to $(V_{REF}-V_{th})$, but not instantly. $C_{TAIL}$ 320 must discharge first before transistor 316 will turn on. When $C_{TAIL}$ 320 is discharged to a voltage of $(V_{REF}-V_{th})$, transistor 316 turns on and discharges $V_{OUT}$ 308, allowing the output to go low. Resistor 318 allows the discharge process to be partially sped up. $V_{OUT}$ 308 is able to transition high quickly, but needs more time to transition from high to low. The falling edge decode takes longer than the rising edge decode because $C_{TAIL}$ 320 has to discharge first. One solution to decrease the delay for both a rising edge and a falling edge is to have two separate input circuits, a first circuit to decode a rising edge and a second circuit to decode a falling edge.

Figure 4:
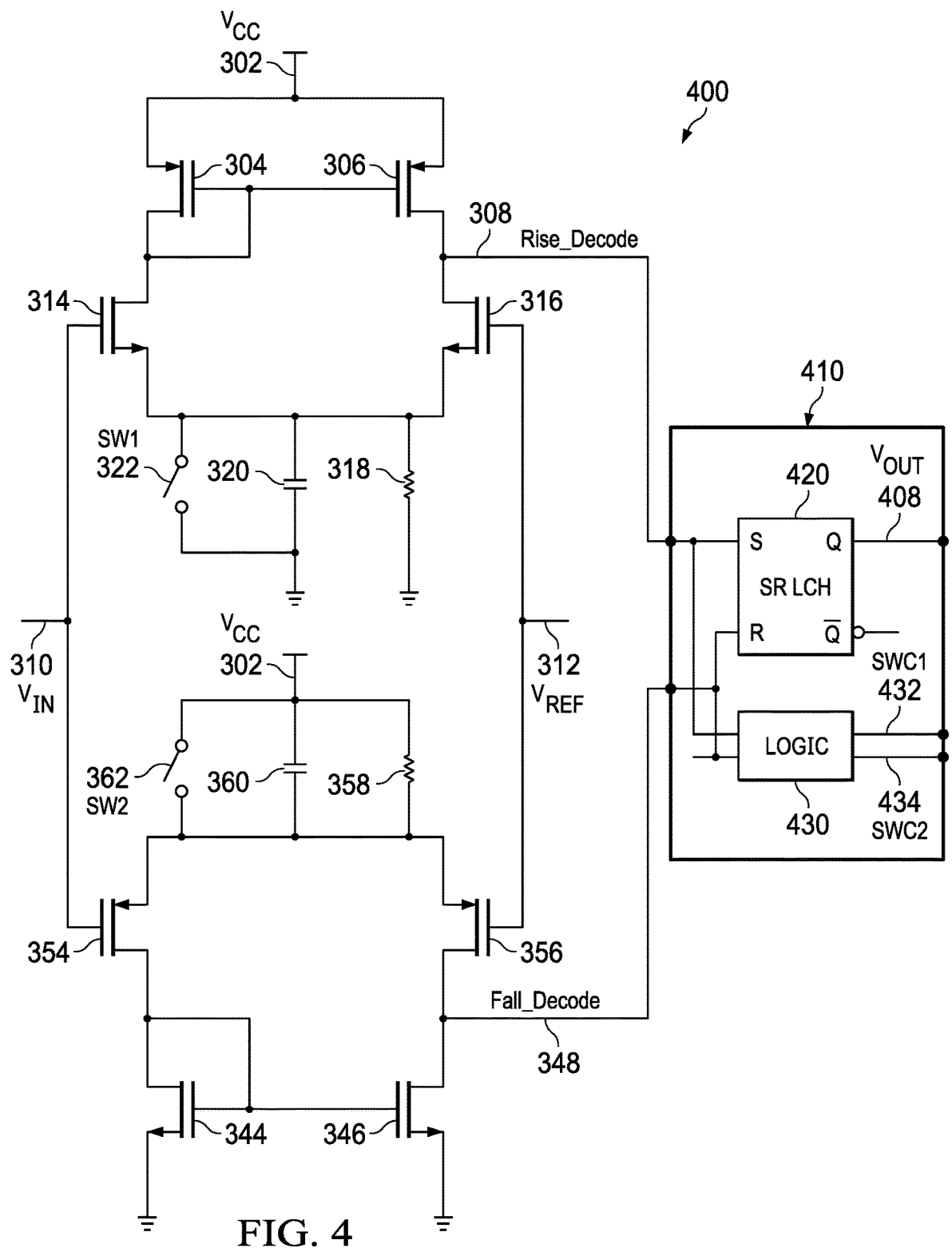
FIG. 4 is a schematic diagram for an example continuous-time comparator with separate input circuits for decoding a rising edge and decoding a falling edge.

FIG. 4 is a schematic diagram for a continuous-time comparator 400 with separate input circuits for decoding a rising edge and decoding a falling edge. The two circuits share common inputs and have a similar architecture, but the transistors in the second circuit have opposite doping polarity to the transistors in the first circuit. Although field effect transistors are shown, bipolar junction transistors could be used in their place. The upper circuit in FIG. 4 is for decoding a rising edge and provides a Rise_Decode signal as its output, and the lower circuit is for decoding a falling edge and provides a Fall_Decode signal as its output.

The comparator input signal $V_{IN}$ 310 is provided to the gate terminals of transistors 314 and 354. The threshold reference signal $V_{REF}$ 312 is provided to the gate terminals of transistors 316 and 356. Transistor 304 is coupled between the supply voltage terminal $V_{CC}$ 302 and the drain terminal of transistor 314. Transistor 306 is coupled between the supply voltage terminal $V_{CC}$ 302 and the drain terminal of transistor 316. Transistor 344 is coupled between the drain terminal of transistor 354 and ground. Transistor 346 is coupled between the drain terminal of transistor 356 and ground.

The gate of transistor 304 is coupled to the drain of transistor 314 and to the gate of transistor 306. The gate of transistor 344 is coupled to the drain of transistor 354 and to the gate of transistor 346. The tail capacitor 320 is coupled in parallel with resistor 318 and switch SW1 322. The parallel combination of capacitor 320, resistor 318 and switch SW1 322 is coupled between ground and the sources of transistors 314 and 316. The tail capacitor 360 is coupled in parallel with resistor 358 and switch SW2 362. The parallel combination of capacitor 360, resistor 358 and switch SW2 362 is coupled between $V_{CC}$ 302 and the sources of transistors 354 and 356.

The Rise_Decode signal 308, the decode signal for a rising edge of $V_{IN}$ 310, is provided by the drain terminal of transistor 316, which is coupled to a first input of decode logic circuit 410. The Fall_Decode signal 348, the decode signal for a falling edge of $V_{IN}$ 310, is provided by the drain of transistor 356, which is coupled to a second input of decode logic circuit 410. A first output SWC1 432 of the decode logic circuit 410 controls the opening and closing of switch SW1 322. A second output SWC2 434 of the decode logic circuit 410 controls the opening and closing of switch SW2 362.

Decode logic circuit 410 includes an SR latch 420 and a digital logic circuit 430. SR latch 420 has a set input coupled to the first input of the decode logic circuit 410 which receives the Rise_Decode signal 308. SR latch 420 has a reset input coupled to the second input of the decode logic circuit 410 which receives the Fall_Decode signal 348. The output of SR latch 420 is coupled to the comparator output terminal $V_{OUT}$ 408.

The digital logic circuit 430 has a first input coupled to the first input of the decode logic circuit 410 which receives the Rise_Decode signal 308. The digital logic circuit 430 has a second input coupled to the second input of the decode logic circuit 410 which receives the Fall_Decode signal 348. The digital logic circuit 430 has a first output SWC1 432 coupled to the first output of the decode logic circuit 410. The digital logic circuit 430 has a second output SWC2 434 coupled to the second output of the decode logic circuit 410. SWC1 432 controls the switching of switch SW1 322, and SWC2 434 controls the switching of switch SW2 362. The timing for the switching of SW1 322 and SW2 362 is based on the comparator input $V_{IN}$ 310, so no external clock is needed for controlling the switches, which in turn control the charging and discharging of capacitors 320 and 360. A rising edge decision will always follow a falling edge decision, and a falling edge decision will always follow a rising edge decision. After a falling edge decision is made, SWC1 432 will cause SW1 322 to open, charging capacitor 320. After the rising edge decision is made, SWC1 432 will cause SW1 to close, discharging capacitor 320.

Figure 5:
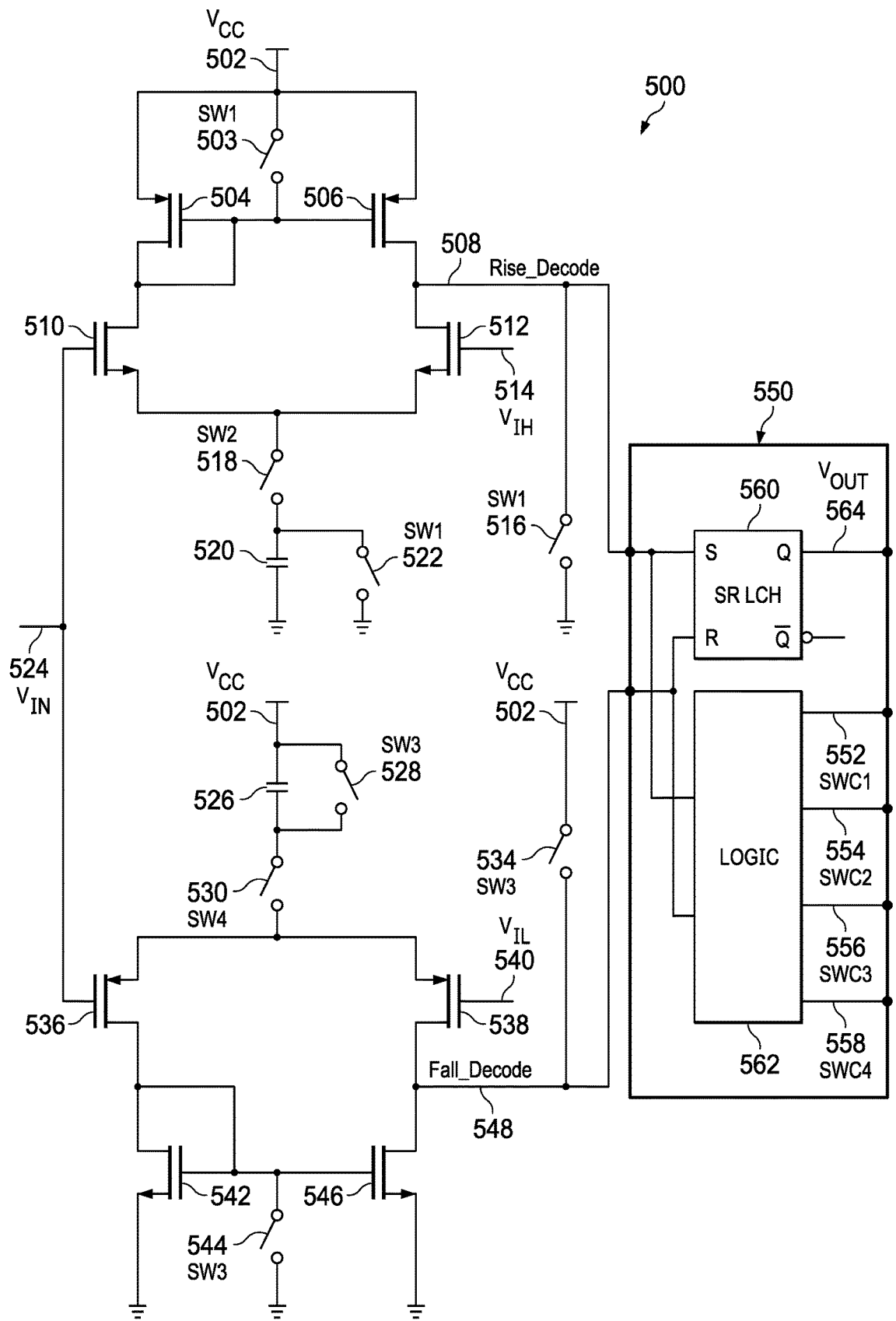
FIG. 5 is a schematic diagram for an example sampled clock comparator.

FIG. 5 is a schematic diagram 500 for a sampled clock comparator. Sampled clock comparators are sometimes used in the front end of a sampled network, such as with an ADC or a switched capacitor circuit. Sampled clock comparators can be useful in systems where the input signal is sampled on one edge of the clock, and where speed and resolution are important. Comparator 500 has two separate input circuits, a first circuit to decode a rising edge on the input signal and a second circuit to decode a falling edge on the input signal. The two input circuits share a common input signal and have a similar architecture, but the transistors in second circuit have opposite doping polarity to the transistors in the first circuit. Although field effect transistors are shown, bipolar junction transistors could be used in their place. The upper input circuit in FIG. 5 is for decoding a rising edge and provides a Rise_Decode signal, and the lower input circuit is for decoding a falling edge and provides a Fall_Decode signal.

The comparator input signal $V_{IN}$ 524 is provided to the gates of transistors 510 and 536. The upper threshold reference voltage $V_{IH}$ 514 is provided to the gate of transistor 512. $V_{IH}$ 514 is the reference voltage above which the input signal $V_{IN}$ 524 will be decoded as a HIGH. The lower threshold reference voltage $V_{IL}$ 540 is provided to the gate of transistor 538. $V_{IL}$ 540 is the reference voltage below which the input signal $V_{IN}$ 524 will be decoded as a LOW. For most embodiments, $V_{IH}$ 514 has a higher voltage than $V_{IL}$ 540. However, in at least one embodiment, $V_{IH}$ 514 can have the same voltage as $V_{IL}$ 540.

Transistor 504 is coupled between the supply voltage terminal $V_{CC}$ 502 and the drain of transistor 510. Transistor 506 is coupled between the supply voltage terminal $V_{CC}$ 502 and the drain of transistor 512. Transistor 542 is coupled between the drain of transistor 536 and ground. Transistor 546 is coupled between the drain of transistor 538 and ground.

The gate terminal of transistor 504 is coupled to the drain terminal of transistor 510 and the gate of transistor 506. The gate of transistor 542 is coupled to the drain of transistor 536 and the gate of transistor 546. A first tail capacitor 520 is coupled in parallel with SW1 switch 522. The parallel combination of capacitor 520 and switch 522 is coupled between ground and the sources of transistors 510 and 512 through SW2 switch 518. A second tail capacitor 526 is coupled in parallel with SW3 switch 528. The parallel combination of capacitor 526 and switch 528 is coupled between $V_{CC}$ 502 and the sources of transistors 536 and 538 through SW4 switch 530.

The Rise_Decode signal 508, the decode signal for a rising edge of $V_{IN}$ 524, is provided by the drain of transistor 512, which is coupled to a first input of decode logic circuit 550. The drain of transistor 512 is also coupled to ground through SW1 switch 516. The Fall_Decode signal 548, the decode signal for a falling edge of $V_{IN}$ 524, is provided by the drain of transistor 538, which is coupled to a second input of decode logic circuit 550. The drain of transistor 538 is also coupled to $V_{CC}$ 502 through SW3 switch 534. Decode logic circuit 550 includes digital logic circuit 562. A first output SWC1 552 of the decode logic circuit 550 controls the opening and closing of SW1 switches 503, 516 and 522. A second output SWC2 554 of the decode logic circuit 550 controls the opening and closing of SW2 switch 518. A third output SWC3 556 of the decode logic circuit 550 controls the opening and closing of SW3 switches 528, 534 and 544. A fourth output SWC4 558 of the decode logic circuit 550 controls the opening and closing of SW4 switch 530.

During a precharge phase, switch control signals SWC1 and SWC3 close SW1 switches 503, 516 and 522, and SW3 switches 528, 534 and 544, resetting the nodes in the circuit to a predefined value. This is done by discharging capacitors 520 and 526, and pulling Rise_Decode 508 to ground and Fall_Decode 548 to $V_{CC}$. The sampling phase follows the precharge phase. During the sampling phase, the comparator input signal $V_{IN}$ 524 is provided to the gates of transistors 510 and 536. The decision phase follows the sampling phase. During the decision phase, the comparator input signal $V_{IN}$ 524 is compared to the upper and lower threshold limits, $V_{IH}$ 514 and $V_{IL}$ 540, respectively, and a determination of the comparator output $V_{OUT}$ 564 is made.

Prior to the sampling phase, s switch control signals SWC1 and SWC3 open switches SW1 and SW3. During the sampling phase, switch control signal SWC2 closes SW2 switch 518, and control signal SWC4 closes SW4 switch 530. Closing SWC2 and SWC4 connects capacitors 520 and 526 to their respective tail nodes, allowing them to provide current in response to the input voltage. If $V_{IN}$ 524 is greater than $V_{IH}$ 514, a charging current will flow in the upper input circuit and Rise_Decode 508 will go high. If $V_{IN}$ 524 is lower than $V_{IL}$ 540, a charging current will flow in the lower input circuit and Fall_Decode 548 will go high. SR latch 560 receives Rise_Decode 508 and Fall_Decode 548 as its inputs and provides an output determination responsive to Rise_Decode 508 and Fall_Decode 548. The output of latch 560 is the comparator output, $V_{OUT}$ 564.

As used herein, the terms "terminal", "node", "interconnection", "lead" and "pin" are used interchangeably. Unless specifically stated to the contrary, these terms are generally used to mean an interconnection between or a terminus of a device element, a circuit element, an integrated circuit, a device, or other electronics or semiconductor component.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

In this description, even if operations are described in a particular order, some operations may be optional, and the operations are not necessarily required to be performed in that particular order to achieve desirable results. In some examples, multitasking and parallel processing may be advantageous. Moreover, a separation of various system components in the embodiments described above does not necessarily require such separation in all embodiments.

Modifications are possible in the described embodiments, and other embodiments are possible, within the scope of the claims.

What is claimed is:

1. A comparator circuit comprising:
a rising edge decode circuit having first and second rising edge inputs and a rising edge output, the first rising edge input coupled to an input voltage terminal, the second rising edge input coupled to a reference voltage terminal, and the rising edge output providing a rising edge decode signal the input signal, wherein the rising edge decode circuit includes:

a first transistor having a first control terminal and first and second transistor current terminals, the first control terminal coupled to the input voltage terminal;

a second transistor having a second control terminal and third and fourth transistor current terminals, the second control terminal coupled to the reference voltage terminal, the third transistor current terminal coupled to the set input, and the fourth transistor current terminal coupled to the second transistor current terminal;

a third transistor coupled between a power supply terminal and the first transistor current terminal and having a third control terminal;

a fourth transistor coupled between the power supply terminal and the third transistor current terminal and having a fourth control terminal, wherein the fourth control terminal is connected to the third control terminal;

a switch coupled between the second transistor current terminal and ground; and a capacitor coupled in parallel with the switch;

a falling edge decode circuit having first and second falling edge inputs and a falling edge output, the first falling edge input coupled to the input voltage terminal, the second falling edge input coupled to the reference voltage terminal, and the falling edge output providing a falling edge decode signal responsive to the input signal transitioning from being larger than the reference voltage signal to being smaller than the reference voltage signal;

a latch having set and reset inputs and a latch output, the set input coupled to the rising edge output, the reset input coupled to the falling edge output; and a switch control circuit having first and second switch control inputs and first and second switch control outputs, the first switch control input coupled to the set input, and the second switch control input coupled to the reset input.

2. The circuit of claim 1, wherein the switch is a first switch, and the falling edge decode circuit includes:

a fifth transistor having a fifth control terminal and fifth and sixth transistor current terminals, the fifth control terminal coupled to the input voltage terminal;

a sixth transistor having a sixth control terminal and seventh and eighth transistor current terminals, the sixth control terminal coupled to the reference voltage terminal, the seventh transistor current terminal coupled to the fifth transistor current terminal, and the eighth transistor current terminal coupled to the reset input;

a seventh transistor coupled between the sixth transistor current terminal and ground;

an eighth transistor coupled between the eighth transistor current terminal and ground, wherein the seventh and eighth transistors form a current mirror; and a second switch coupled between the power supply terminal and the fifth transistor current terminal; and a second capacitor coupled between the power supply terminal and the fifth transistor current terminal.

3. The circuit of claim 2, wherein a first resistor is coupled in parallel with the first capacitor, and a second resistor is coupled in parallel with the second capacitor.

4. The circuit of claim 2, wherein the first switch control output controls the first switch, and the second switch control output controls the second switch.

5. The circuit of claim 2, wherein closing the first and second switches sets the voltages across the first and second capacitors, respectively, to known values.

6. The circuit of claim 1, wherein the reference voltage signal is a DC voltage.

7. A comparator circuit comprising:

a rising edge decode circuit having first and second rising edge inputs and a rising edge output, the first rising edge input configured to receive an input signal, the second rising edge input configured to receive an upper reference voltage signal, and the rising edge output providing a rising edge decode signal, the rising edge decode circuit including:

a first transistor having a first control terminal and first and second transistor current terminals, the first control terminal coupled to the first rising edge input;

a second transistor having a second control terminal and third and fourth transistor current terminals, the second control terminal coupled to the second rising edge input, the third transistor current terminal coupled to the set input, and the fourth transistor current terminal coupled to the second transistor current terminal;

a third transistor coupled between a power supply terminal and the first transistor current terminal;

a fourth transistor coupled between the power supply terminal and the third transistor current terminal, wherein the third and fourth transistors form a current mirror;

a first switch coupled between the third transistor current terminal and ground; and a capacitor coupled between the second transistor current terminal and ground through a second switch;

a falling edge decode circuit having first and second falling edge inputs and a falling edge output, the first falling edge input configured to receive the input signal, the second rising edge input configured to receive a lower reference voltage signal, and the falling edge output providing a falling edge decode signal; and a latch having set and reset inputs and a latch output, the set input coupled to the rising edge output, the reset input coupled to the falling edge output; and a switch control circuit having first and second switch control inputs and first and second switch control outputs, the first switch control input coupled to the set input, and the second switch control input coupled to the reset input.

8. The circuit of claim 7, wherein the capacitor is a first capacitor, and the falling edge decode circuit includes:

a fifth transistor having a third control terminal and fifth and sixth transistor current terminals, the third control terminal coupled to the first falling edge input;

a sixth transistor having a fourth control terminal and seventh and eighth transistor current terminals, the fourth control terminal coupled to the second falling edge input, the seventh transistor current terminal coupled to the fifth transistor current terminal, and the eighth transistor current terminal coupled to the reset input;

a seventh transistor coupled between the sixth transistor current terminal and ground;

an eighth transistor coupled between the eighth transistor current terminal and ground, wherein the seventh and eighth transistors form a current mirror;

a third switch coupled between the power supply terminal and the eighth transistor current terminal; and a second capacitor coupled between the power supply terminal and the fifth transistor current terminal through a fourth switch.

9. The circuit of claim 8, further including a fifth switch connected in parallel with the first capacitor, and a sixth switch connected in parallel with the second capacitor.

10. The circuit of claim 9, wherein the first switch control output controls the first switch and the fifth switch, the second switch control output controls the second switch, the third switch control output controls the third switch and the sixth switch, and the fourth switch control output controls the fourth switch.

11. The circuit of claim 7, wherein closing the first and third switches sets the rising edge decode signal and the falling edge decode signal, respectively, to known values.

12. The circuit of claim 7, wherein the upper reference voltage signal and lower reference voltage signal are DC voltages.

13. A comparator circuit comprising:
a first transistor having a first control terminal and first and second transistor current terminals, the first control terminal configured to receive an input signal;
a second transistor having a second control terminal and third and fourth transistor current terminals, the second control terminal configured to receive a reference voltage signal, the third transistor current terminal coupled to an output terminal, and the fourth transistor current terminal coupled to the second transistor current terminal;
a third transistor coupled between a power supply terminal and the first transistor current terminal;
a fourth transistor coupled between the power supply terminal and the third transistor current terminal, wherein the third and fourth transistors form a current mirror;
a switch coupled between the second transistor current terminal and ground; and
a capacitor coupled between the second transistor current terminal and ground; and
a resistor coupled in parallel with the capacitor.

14. The circuit of claim 13, wherein the switch closing sets the voltage across the capacitor to a known value.

15. The circuit of claim 13, wherein the reference voltage signal is a DC voltage.

* * * * *